(12) United States Patent
Kamidi et al.

(10) Patent No.: US 8,854,607 B2
(45) Date of Patent: Oct. 7, 2014

(54) CONTROLLER, LITHOGRAPHIC APPARATUS, METHOD OF CONTROLLING THE POSITION OF AN OBJECT AND DEVICE MANUFACTURING METHOD

(75) Inventors: Ramidin Izair Kamidi, Eindhoven (NL); Hans Butler, Best (NL); Martijn Houkes, Sittard (NL); Marinus Maria Johannes Van De Wal, Oirschot (NL); Jeroen Johan Maarten Van De Wijdeven, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 339 days.

(21) Appl. No.: 13/275,737

(22) Filed: Oct. 18, 2011

(65) Prior Publication Data

US 2012/0127449 A1    May 24, 2012

Related U.S. Application Data

(60) Provisional application No. 61/415,971, filed on Nov. 22, 2010.

(51) Int. Cl.
*G03B 27/58* (2006.01)
*G03B 27/62* (2006.01)
*G05B 19/402* (2006.01)
*G03F 7/20* (2006.01)

(52) U.S. Cl.
CPC .. *G03F 7/70725* (2013.01); *G05B 2219/45028* (2013.01); *G05B 19/402* (2013.01); *G05B 2219/41017* (2013.01)

USPC ............................................. 355/72; 355/75

(58) Field of Classification Search
CPC ............................ G03F 7/70725; G03F 7/709
USPC .............. 355/53, 72–76; 318/432; 310/10, 12
See application file for complete search history.

(56) References Cited

U.S. PATENT DOCUMENTS 6,903,806 B2 *   6/2005   Morisada ........................ 355/72
7,030,581 B1 *   4/2006   Ikeda ............................ 318/432

(Continued)

FOREIGN PATENT DOCUMENTS

JP      02-221568 A      9/1990
JP      07-094575 A      4/1995

(Continued)

OTHER PUBLICATIONS

English-Language Abstract for Japanese Patent Publication No. 07-094575 A, published Apr. 7, 1995; 1 page.

(Continued)

*Primary Examiner* — Hung Henry Nguyen
(74) *Attorney, Agent, or Firm* — Sterne, Kessler, Goldstein & Fox P.L.L.C

(57) ABSTRACT

A controller is provided that controls an actuator system having a plurality of actuators arranged to act on an object. The controller uses a gain balancing matrix to convert a first control signal, representing a set of forces desired to be provided to the center of gravity of the object into a second control signal, representing an equivalent set of forces to be provided by the plurality of actuators. The system is further configured such that a first gain balancing matrix is used at a first frequency band and a second gain balancing matrix is used at a second frequency band.

15 Claims, 5 Drawing Sheets

(56) References Cited

U.S. PATENT DOCUMENTS

| | | |
|---|---|---|
| 7,133,115 B2 | 11/2006 | Nawata et al. |
| 7,630,059 B2 * | 12/2009 | Butler et al. .................... 355/72 |
| 7,782,446 B2 * | 8/2010 | Kamidi et al. .................. 355/75 |
| 8,378,615 B2 * | 2/2013 | Tazawa et al. ................. 318/619 |
| 2011/0046795 A1 | 2/2011 | Fujimoto et al. |

FOREIGN PATENT DOCUMENTS

| | | |
|---|---|---|
| JP | 2000-247741 A | 9/2000 |
| JP | 2003-228422 A | 8/2003 |
| JP | 2005-123287 A | 5/2005 |
| JP | 2006-107252 A | 4/2006 |
| JP | 2008-219001 A | 9/2008 |
| JP | 2009-147136 A | 7/2009 |
| JP | 4-493484 B2 | 6/2010 |
| WO | WO 2009/031654 A1 | 3/2009 |

OTHER PUBLICATIONS

English-Language Abstract for Japanese Patent Publication No. 2000-247741 A, published Sep. 12, 2000; 1 page.

English-Language Abstract for Japanese Patent Publication No. 2006-107252 A, published Apr. 20, 2006; 1 page.

English-Language Abstract for Japanese Patent Publication No. 2009-147136 A, published Jul. 2, 2009; 1 page.

English-Language Abstract for Japanese Patent Publication No. 02-221568 A, published Sep. 4, 1990; 1 page.

English-Language Abstract for Japanese Patent Publication No. 4-493484 B2, published Jun. 30, 2010; 1 page.

* cited by examiner

CONTROLLER, LITHOGRAPHIC APPARATUS, METHOD OF CONTROLLING THE POSITION OF AN OBJECT AND DEVICE MANUFACTURING METHOD

CROSS REFERENCE TO RELATED APPLICATIONS

This application claims the benefit under 35 U.S.C. §119 (e) to U.S. Provisional Patent Application No. 61/415,971, filed Nov. 22, 2010, which is incorporated by reference herein in its entirety.

BACKGROUND

1. Field of the Present Invention

The present invention relates to a controller, a lithographic apparatus, a method of controlling the position of an object and a method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

The position and/or movement of an object in a lithographic apparatus, such as a support on which a patterning device may be supported and/or a substrate table on which a substrate may be supported, is required to be controlled very accurately. Furthermore, the object may be moved and controlled in six degrees of freedom. A control system may be provided to control an actuator system used to provide the required position and/or movement of the object.

In such a control system, resonant frequencies may result in unacceptable positioning errors. In particular, difficulties may be caused by resonant frequencies of deformation of the object itself. This may be particularly true if the position of the object is measured at a plurality of locations on the object (for example using encoders or interferometers) and two or more measurements are used to deduce another position or displacement, such as a rotation about an axis. In that case, deformation of the object may result in erroneous determination of the position of the object, depending on the actual position of the object. This in turn may feed back into the control system.

Accordingly, it may be necessary to limit the bandwidth of the control system in order to avoid stability problems induced by such resonant frequencies. This is especially true if the resonant behaviour manifests itself in the measured position in a varying manner, e.g., depending on the actual position of the object. However, lowering the bandwidth as a solution to this problem could lead to unacceptably large position errors.

SUMMARY

It is desirable to provide an improved control system.

In one embodiment of the present invention, there is provided a controller, configured to control an actuator system used to control the position of an object within a positioning device, in which the actuator system includes a plurality of actuators arranged to act on the object. The controller comprises a processor, configured to use a gain balancing matrix to convert a first control signal, representing a set of forces desired to be provided to the center of gravity of the object, into a second control signal, representing an equivalent set of forces to be provided by the plurality of actuators, and the processor is configured such that a first gain balancing matrix is used at least when the first control signal is in a first frequency band and a second gain balancing matrix is used at least when the first control signal is in a second frequency band.

In another embodiment of the present invention, there is provided a lithographic apparatus comprising: an illumination system configured to condition a radiation beam, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, an actuator system configured to control the position of one of the support and the substrate table, and a controller as specified above, configured to control the actuator system.

In a still further embodiment of the present invention, there is provided method of controlling the position of an object in a lithographic apparatus, comprising: using a plurality of actuators to apply forces to the object, using a gain balancing matrix to convert a first control signal, representing a set of forces desired to be provided to the center of gravity of the object, into a second control signal, representing an equivalent set of forces to be provided by the plurality of actuators. A first gain balancing matrix is used at least when the first control signal is in a first frequency band and a second gain balancing matrix is used at least when the first control signal is in a second frequency band.

In another embodiment of the present invention, there is provided a device manufacturing method, comprising transferring a pattern from a patterning device, supported on a support, to a substrate, supported on a substrate table. The position of at least one of the support and the substrate table is controlled during the step of transferring the pattern by: using a plurality of actuators to apply forces to the one of the support and the substrate table, using a gain balancing matrix to convert a first control signal, representing a set of forces desired to be provided to the center of gravity of the one of the support and the substrate table, into a second control signal, representing an equivalent set of forces to be provided by the plurality of actuators. A first gain balancing matrix is used at least when the first control signal is in a first frequency band and a second gain balancing matrix is used at least when the first control signal is in a second frequency band.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
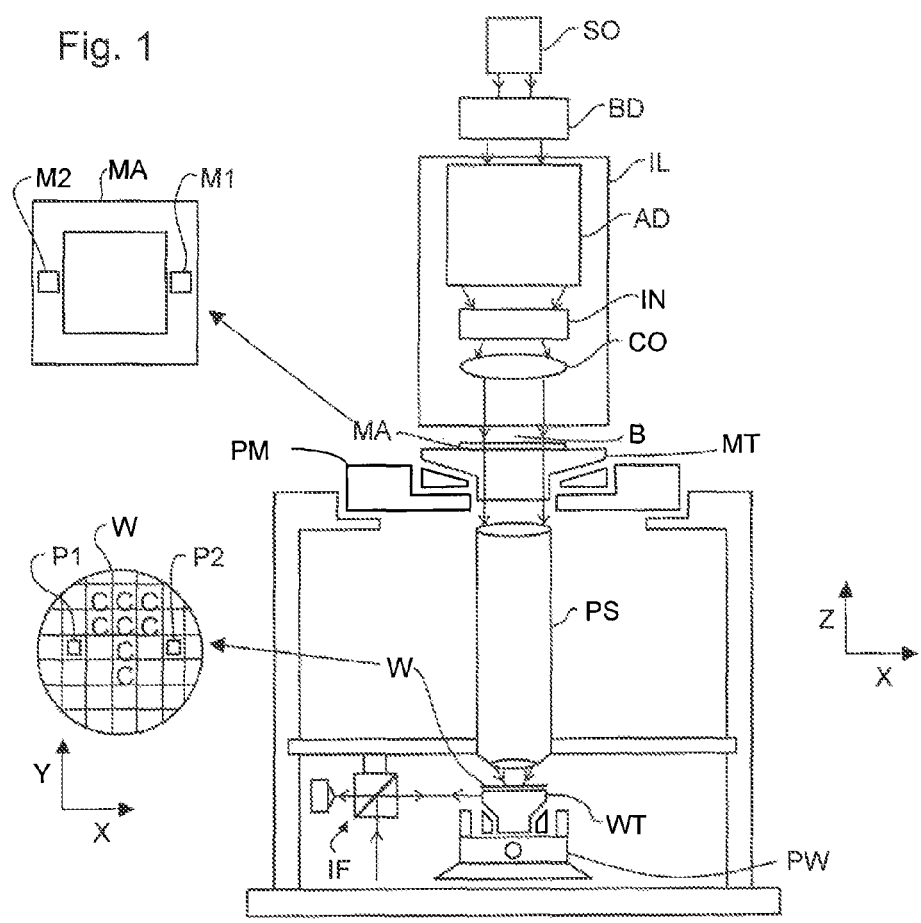
FIG. 1 depicts a lithographic apparatus, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus comprises: an illumination system (illuminator) IL configured to condition a radiation beam B (e.g., UV radiation or any other suitable radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As discussed above, embodiments of the present invention relate to a control system for controlling an actuator system that may, for example, be used to control the position and/or movement of an object in a lithographic apparatus.

In a control system for controlling an actuator system, it may be taken into account that the forces applied by a plurality of actuators in the actuator system may not act through the center of gravity. Accordingly, for example, the actuator system may include a plurality of actuators that each apply forces in different respective directions and may be applied at different positions of the object. Accordingly, a function of the control system may be to determine the required forces to be applied by each of the actuators within the actuator system in order to result in a desired movement.

For example, the control system may include a processor that is configured to determine the required forces to be applied by the actuators in order to provide the required movement. Such a processor may, for example, be formed from an appropriate computer system. It will be appreciated, however, that dedicated hardware may also be provided to function as the processor within the control system.

The processor may use a gain scheduling matrix in order to determine from a desired reference position and controller forces of the object, for example with respect to a substantially inertial reference such as the projection optics in a lithographic apparatus, the forces that would need to be applied to the centre of gravity of the object in order to provide the required displacement and/or acceleration (for example with respect to the projection optics). It will be appreciated that the forces referred to above may include torques as well as linearly acting forces.

The control system may further include a gain balancing matrix used to convert the output of the gain scheduling matrix, into the forces that are required to be applied by each of the actuators within the actuator system such that the combination of the forces applied by the actuators is equivalent to the forces required to be applied to the centre of gravity of the object.

The determination of the values used in the gain balancing matrix may be determined from the geometry of the object, in particular from a knowledge of the spatial distribution of the locations at which the actuators apply their forces and the distribution of mass of the object, together with knowledge of the direction in which the forces provided by the actuators act.

However, such analysis assumes that the object is a truly rigid body. In reality, the object may deform under the application of the forces by the actuators, with the result that the gain balancing matrix may not always precisely reflect the geometry of the object. This may introduce errors.

Such errors may be magnified by other effects within the control system. For example, in order to provide feedback control, the control system may need to determine the position and orientation of the object. In order to attain this, encoders or interferometers, for example, may be used to measure the position of a plurality of locations on the object. Two or more of the measured positions may be combined in order to determine further positional information regarding the object. For example, two or more positions may be used in order to calculate an angle of orientation of the object. Deformations of the object, namely deviations from a true rigid body response, may result in errors of the positional information propagating through the control systems. This may be particularly true where the deformations affect the accuracy of a position that is determined by using two different position measurements at different respective locations on the object.

The inventors have identified that a particular problem for an object such as a stage within a positioning system for a substrate table in a lithographic apparatus and/or a support for a patterning device within a lithographic apparatus my occur at resonant frequencies of the object, in particular, the torsional vibration mode resonant frequency and the saddle vibration mode resonant frequency.

In one example, improvement of the control system uses at least two gain balancing matrices. A first gain balancing matrix may be used under most conditions, in particular for frequencies away from a known problematic resonant frequency or resonant frequencies. Such a first gain balancing matrix may, for example, be a gain balancing matrix that is determined for the object treating it as a truly rigid body.

For frequencies around one or more known problematic resonant frequencies, a different gain balancing matrix may be used that is selected to reduce the response of the system to the particular mode of vibration at the resonant frequency. It will be appreciated that a plurality of different gain balancing matrices may be provided, each associated with a particular mode of vibration at a particular resonant frequency.

A particular choice of a gain balancing matrix that is used for a particular mode of vibration may be made such that this mode is not excited. In other words, the combination of actuator forces is such that the mode of vibration is not induced. Such a gain balancing matrix can be obtained by determining the dynamic modes of the object by modal decoupling analysis, and ensuring that the product of the eigenvector corresponding to the vibration mode of interest with any row in the gain balancing matrix is zero.

Figure 2:
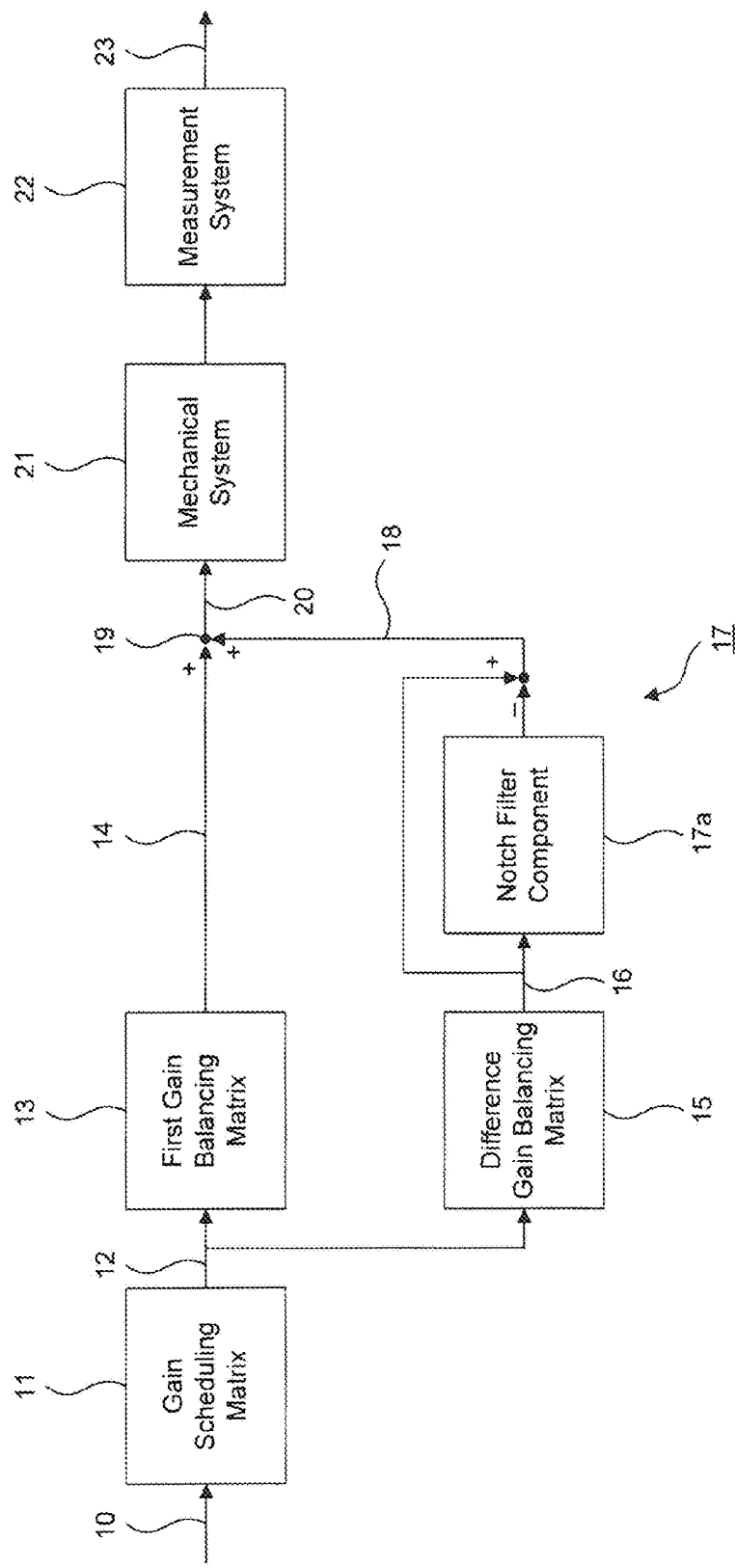
FIG. 2 depicts a control system, according to an embodiment of the present invention.

FIG. 2 depicts an arrangement of a control system according to an embodiment of the present invention. The control system is herein described as being particularly for use in controlling the position of an object in a lithographic apparatus, especially for controlling the position of a stage within the positioning system for a substrate table or a support for a patterning device. However, it should be appreciated that it may generally be used in any control system.

As shown, an input control signal 10, representing required control forces, for example with respect to the projection optics, of the object, is received by the system and converted by a gain scheduling matrix 11 to form a first control signal 12, representing a set of forces desired to be provided to the centre of gravity of the object.

The first control signal 12 is converted by a first gain balancing matrix 13 into a first intermediate control signal 14. The first gain balancing matrix 13 is selected to convert the first control signal into a control signal representing an equivalent set of forces to be provided by the plurality of actuators based on an assumption that the object will behave as a rigid body.

Substantially simultaneously, the first control signal 12 is converted by a difference gain balancing matrix 15 to a second intermediate control signal 16. The difference gain balancing matrix 15 is selected to be the difference between the first gain balancing matrix 13 and a second gain balancing matrix that is selected for use at a resonant frequency to reduce excitation of the system at that resonant frequency, as discussed above. Accordingly, the difference gain balancing matrix 15 is selected such that the sum of the first and second intermediate control signals 14, 16 is the equivalent of converting the first control signal 12 using the second gain balancing matrix.

In order that the second gain balancing matrix is effectively used only at and around the associated resonant frequency, the second intermediate control signal 16 is passed through a notch filter 17 that is configured to pass signals only in a specified frequency band, namely a range of frequencies selected around the resonant frequency. The resulting third intermediate control signal 18 is then summed with the first intermediate control signal 14 by an adder 19.

It will be appreciated that, in practice, notch filters are easier to provide that do not pass signals in a narrow frequency range rather than do pass signals in a narrow frequency range, as required in the present invention. Accordingly, as depicted in FIG. 2, the notch filter 17 may be formed from a notch filter component 17a that is configured not to pass signals in the desired frequency band and an arrangement for inverting the resulting signal and adding it to the original second intermediate control signal 16. Such an arrangement may simply provide the desired third intermediate control signal 18, as discussed above.

As will be appreciated, the output of the adder 19 is a second control signal 20 that represents the set of forces to be provided by the plurality of actuators in the actuator system. When this control signal is provided to the actuator system, it results in actuation of the mechanical system 21, namely the combination of the actuator system and the object being actuated.

Subsequently, as described above, a measurement system 22 may measure the resulting position and/or displacement of the object, providing a measurement signal 23 representing the resulting position and/or displacement. If desired, this may be used in a feedback loop of the control system.

It will further be appreciated that the embodiment discussed above in relation to FIG. 2 is only one way to embody a control system in which different gain balancing matrices are used for different frequencies.

Figure 3:
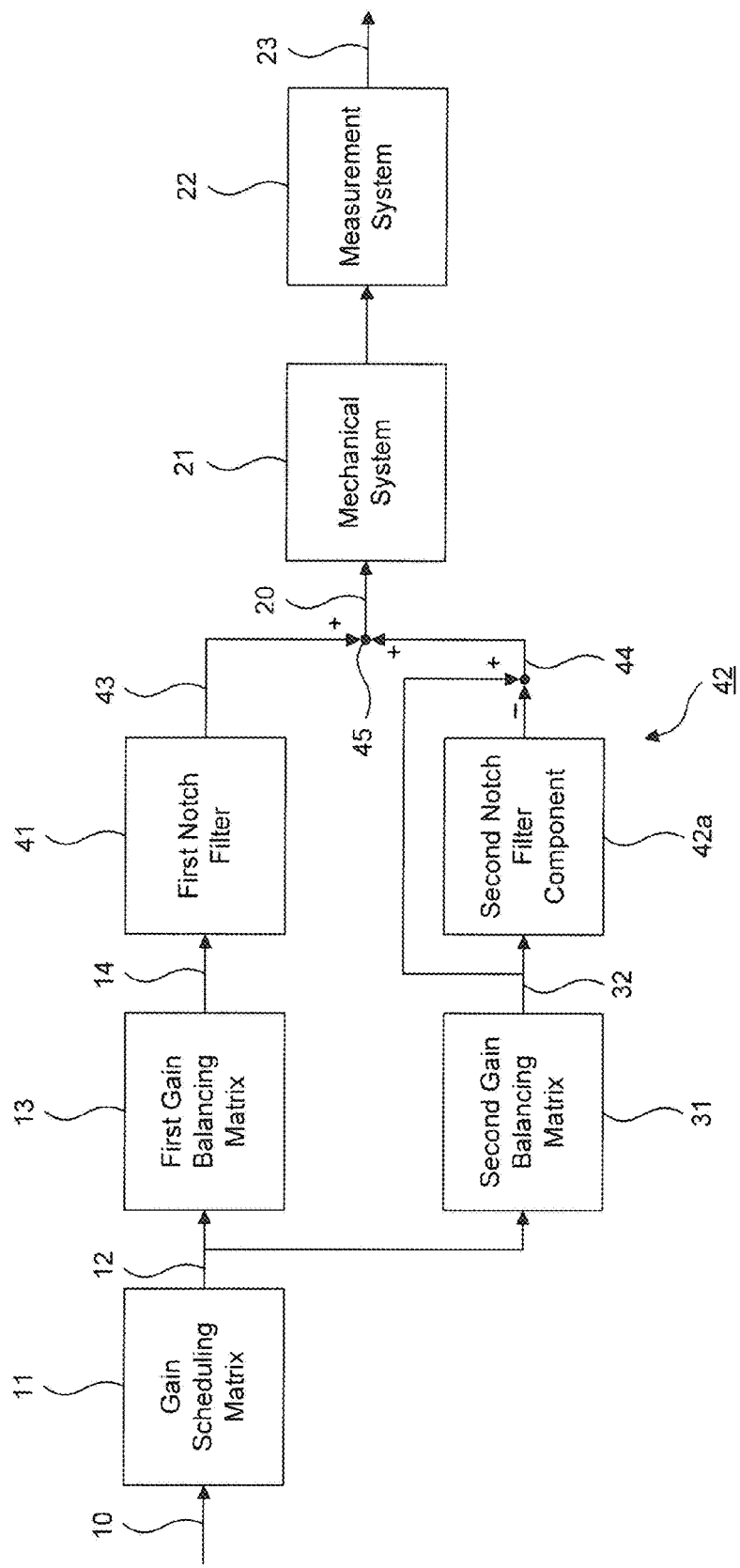
FIG. 3 depicts a control system, according to an embodiment of the present invention.

FIG. 3 depicts an alternative arrangement for utilising two different gain balancing matrices at different respective frequencies. Only the differences from the arrangement depicted in FIG. 2 will be discussed. As with the arrangement depicted in FIG. 2, the first gain balancing matrix 13 is applied to the first control signal 12 to provide a first intermediate control signal 14. However, in this embodiment, the second gain balancing matrix 31 itself is also applied directly to the first control signal 12 in order to provide a second intermediate control signal 32. The first and second intermediate control signals 14, 32 are then combined according to the frequency of the signals in order to provide the second control signal 20.

In particular, a first notch filter 41 is applied to the first intermediate control signal 14 to provide a third intermediate control signal 43. The first notch filter 41 is selected to pass all signals except those having a frequency corresponding to the resonant frequency associated with the second gain balancing matrix 31.

A second notch filter 42 is applied to the second intermediate control signal 32 to provide a fourth intermediate control signal 44. The second notch filter 42 corresponds to the notch filter 41 and blocks the resonance frequency associated with the second gain balancing matrix 31. Because the output of notch filter 42 is subtracted from the input 32, the fourth intermediate control signal 44 only contains the components of signal 32 that do not pass filter 42 (i.e., the resonance frequency associated with the second gain balancing matrix 31). The third and fourth intermediate control signals 43, 44 are summed by an adder 45 to provide the second control signal 20.

It will be appreciated that the arrangements depicted in FIGS. 2 and 3 and discussed above are both configured such that effectively a frequency controlled switch is provided for selecting an intermediate control signal generated by use of either the first or second gain balancing matrix according to the frequency of the first control signal 12. It will be appreciated that alternative arrangements for switching between signals generated from the two different gain balancing matrices according to the frequency may also be provided.

As discussed above, the present invention may be used with control systems in which there are more than one problematic resonant frequency. In that case, it may be desirable to provide a gain balancing matrix for each problematic resonant frequency. The plurality of gain balancing matrices may each be only used at frequencies around the respective resonant frequency. Such gain balancing matrices may be specifically provided to reduce the response of the system at the selected resonant frequency. At other frequencies, namely those away from a problematic resonant frequency, a gain balancing matrix may be used that is generated based on the assumption that the object under control of the actuator system acts as a rigid body.

It will be appreciated that any of the arrangements discussed above may be modified for use with a plurality of different gain balancing matrices, each associated with a respective problematic resonant frequency and each only used at frequencies corresponding to the problematic resonant frequency.

Figure 4:
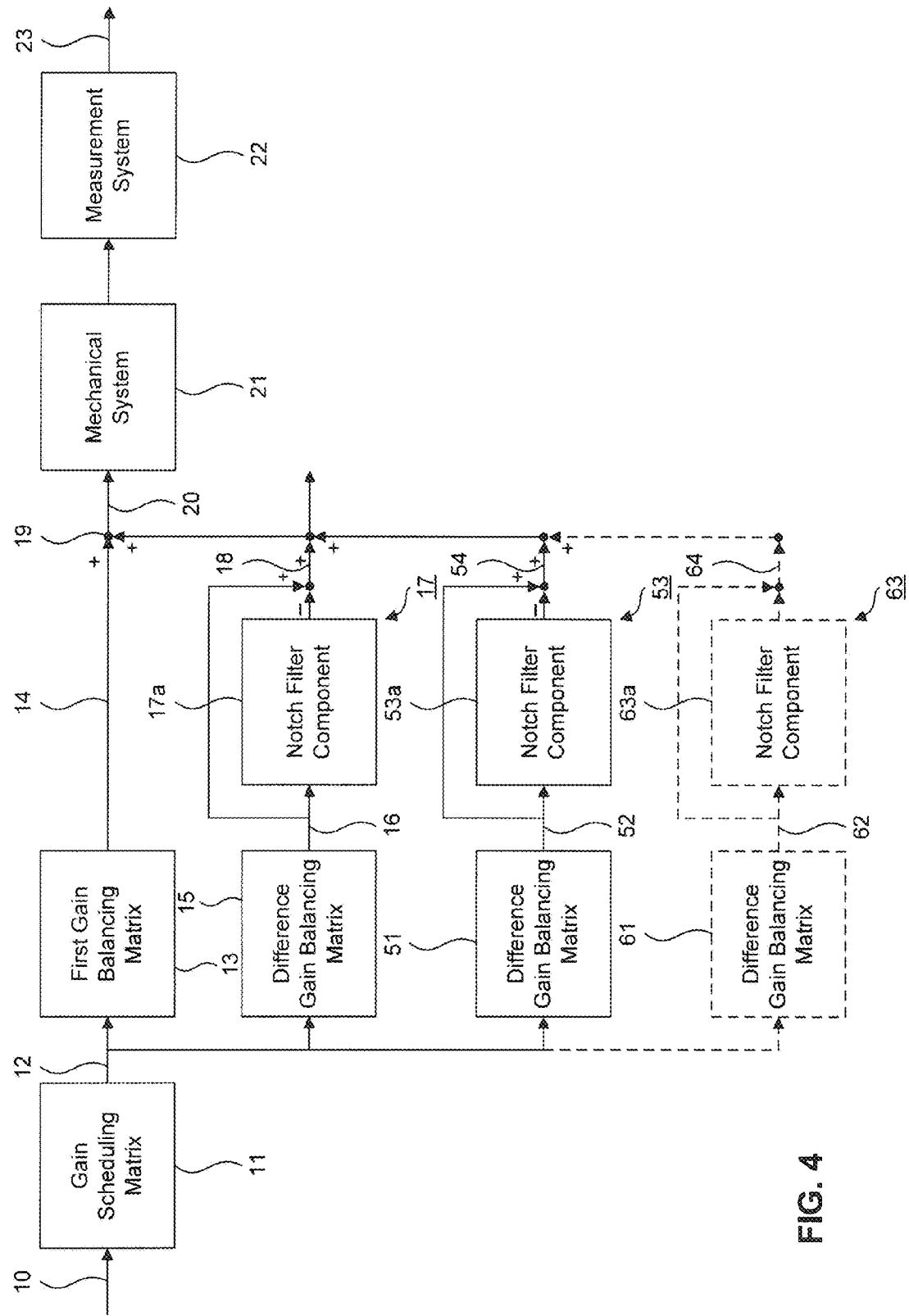
FIG. 4 depicts a control system, according to an embodiment of the present invention.

FIG. 4, for example, depicts a modified arrangement corresponding to FIG. 2. As before, only the differences from the arrangement of FIG. 2 are discussed. As shown, in addition to a first difference gain balancing matrix 15 being provided for a first resonant frequency, additional difference gain balancing matrices 51, 61 are provided, each associated with a problematic resonant frequency. Each of the difference gain balancing matrices 51, 61 correspond to the difference between the first gain balancing matrix 13 used for rigid body behaviour of the object and a gain balancing matrix that is desired to be used at a problematic resonant frequency in order to minimise the response of the system at the resonant frequency. Each of the difference gain balancing matrices 51,61 are applied to the first control signal 12 to produce respective intermediate control signals 52,62.

The intermediate control signals 52,62 are passed through respective notch filters 53,63. The notch filters 53,63 are configured in the same manner as the notch filter 17 such that they only pass signals at frequencies corresponding to the resonant frequency associated with the respective difference gain balancing matrix. For example, each of the notch filters 53,63 may be formed from a notch filter component 53a,63a, configured not to pass signals in the desired frequency band, together with an arrangement for inverting the resulting signal and adding it to the original respective intermediate control signal 52,62, as shown.

The outputs 54,64 of the notch filters 53,63 are added to the first and second intermediate control signals 14,18 in order to provide the second control signal 20.

Accordingly, at a plurality of problematic resonant frequencies a specific gain balancing matrix is effectively used that reduces the response of the system at the resonant frequency but at other frequencies the gain balancing matrix 13 designed for rigid body behaviour of the object is used.

The arrangements discussed above may, for example, be used in a control system that utilises feedback based on the measurements of the position of the object by the measurement system 22. Accordingly, for example, the input control signal 10 may be derived, at least in part, from a feedback loop within the control system. In this case, it may be possible to retune the feedback controller such that the new overall control system has higher bandwidth.

It should be appreciated that embodiments of the present invention may also be utilised in a control system using feed forward controls.

Figure 5:
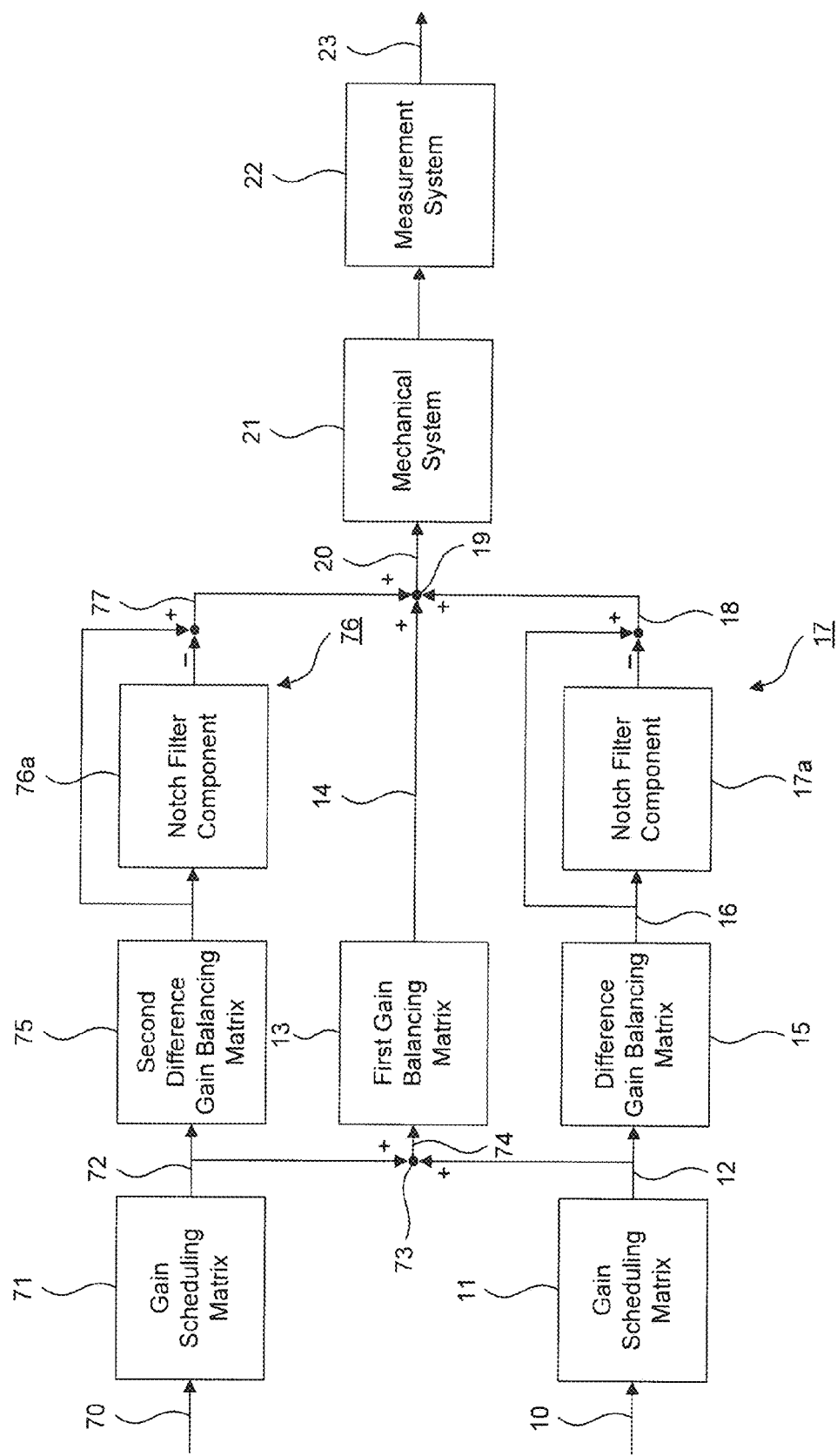
FIG. 5 depicts a control system, according to an embodiment of the present invention.

Furthermore, embodiments of the present invention may also be used in a control system using both inputs from a feedback loop and a feed forward path. FIG. 5 depicts an example of such an arrangement. Parts corresponding to those depicted in FIGS. 2 to 4 are given like references and detailed discussion thereof is omitted.

As shown, an input control signal 10, derived from a feedback loop of the control system may be converted to a first control signal 12 by a gain scheduling matrix 11. As before, a first gain balancing matrix 13 derived for the rigid body behaviour of the object may be used to convert the first control signal 12 into a first intermediate control signal 14. In addition, a difference gain balancing matrix 15 and associated notch filter 17 may be provided for a particular resonant frequency and arranged such that the effect of the first control signal 12 being applied to both the first gain balancing matrix 13 and the difference gain balancing matrix 15 is such that, at the associated resonant frequency, the combined output is equivalent to applying the first control signal 12 to a second gain balancing matrix (of which the different gain balancing matrix is the difference between it and the first gain balancing matrix 13) but, at other frequencies, the effective output is the equivalent of applying the first gain balancing matrix 13 to the first control signal 12.

In addition to the system using the feedback derived signal as discussed above, the arrangement depicted in FIG. 5 also receives an input control signal 70 derived from a feed forward path of the control systems. A corresponding gain scheduling matrix 71 is used to convert this to a third control signal 72 that represent a set of forces desired to be applied to the centre of gravity of the object derived from the feed forward path.

The third control signal 72 may be summed with the first control signal 12 by an adder 73 in order to provide a modified input signal for the first gain balancing matrix 13. Accordingly, the first intermediate control signal 14, namely the output from the first gain balancing matrix 13 corresponds to the combined set of forces desired to be applied by the actuators based on a rigid body analysis of the object.

A second difference gain balancing matrix 75 and corresponding notch filter 76 are provided in the same manner as discussed above in order to effectively apply a second gain balancing matrix at a particular resonant frequency specifically for the input control signal 70 derived from the feed forward path. The intermediate control signal 77 output from the notch filter 76 is summed by the adder 19 together with the first and second intermediate control signals 14,18.

Accordingly, the effect of the combined system depicted in FIG. 5 is that, for both the input control signal 10 derived from the feed back loop and the input control signal 70 derived from the feed forward path, a gain balancing matrix 13 may generally be used that is derived from a rigid body analysis of the object but at problematic resonant frequencies, a different gain balancing matrix may be applied to the input control signals 10,70.

It will be appreciated that problematic resonant frequencies may be the same or may be different for the feedback and feed forward paths, depending on the details of the system. Accordingly, the notch filters 17,76 used for the feedback and feed forward paths, respectively, may be configured to pass signals at substantially the same frequencies, or at different frequencies, accordingly. It should further be appreciated that if notch filters 17, 76 are configured to pass the same frequencies, they may differ in the width of the passband around this frequency. For example, the passband of notch filter 17 may be chosen to be relatively narrow in order to allow proper closed-loop control design, while the passband of notch filter 76 may be relatively wide to allow attenuation of large acceleration feedforward forces. The reverse selection may also have merit.

It will be appreciated that, although the embodiments of the present invention discussed above have utilised notch filters in order to pass or not pass signals in particular frequency bands, the present invention is not limited to the use of notch filters. Other filters may also be used. For example, low pass filters, band pass filters, high pass filters, first order filters, higher order filters, and/or any combination of these may also be used.

It should also be appreciated that, although the arrangement depicted in FIG. 5 depicts an arrangement in which a single additional gain balancing matrix is provided for an associated problematic resonant frequency for each of the feedback and feed forward paths, as with the arrangement depicted in FIG. 5, for example, one or both of the feed forward and feedback paths may be provided with additional gain balancing matrices for use at additional problematic resonant frequencies.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A controller comprising:
   a processor configured to
      apply a first gain balancing matrix to a first control signal, representing a set of forces desired to be provided to a center of gravity of an object, to provide a first intermediate control signal;
      apply a second gain balancing matrix to the first control signal to provide a second intermediate control signal; and
      switch between the first and second intermediate control signals according to a frequency of the first control signal in order to provide a second control signal representing an equivalent set of forces to be provided by a plurality of actuators.

2. A controller comprising:
   a processor configured to:
      apply a first gain balancing matrix to a first control signal, representing a set of forces desired to be provided to a center of gravity of an object, to provide a first intermediate control signal;
      apply a difference gain balancing matrix, that is a difference between the first balancing gain matrix and a second gain balancing matrix, to the first control signal to provide a second intermediate control signal;
      apply a filter to the second intermediate control signal to provide a third intermediate control signal, the filter configured to pass signals at a range of frequencies around a resonant frequency of the object; and
      sum the first and third intermediate control signals to provide a second control signal representing an equivalent set of forces to be provided by a plurality of actuators.

3. A controller comprising:
   a processor configured to:
      apply a first gain balancing matrix to a first control signal, representing a set of forces desired to be provided to a center of gravity of an object, to provide a first intermediate control signal;
      apply a second gain balancing matrix to the first control signal to provide a second intermediate control signal;
      apply a filter to the first intermediate control signal to provide a third intermediate control signal, the filter configured to pass signals having frequencies other than a range of frequencies around a resonant frequency of the object;
      apply a second filter to the second intermediate control signal to provide a fourth intermediate control signal, the second filter configured to pass signals at the range of frequencies around the resonant frequency of the object; and
      sum the third and fourth intermediate control signals to provide a second control signal representing an equivalent set of forces to be provided by a plurality of actuators.

4. A controller comprising:
   a processor configured to use a gain balancing matrix to convert a first control signal, representing a set of forces desired to be provided to a center of gravity of an object, into a second control signal, representing an equivalent set of forces to be provided by a plurality of actuators,
   wherein the gain balancing matrix includes a first gain balancing matrix used at least if the first control signal is in a first frequency band and a second gain balancing matrix used at least if the first control signal is in a second frequency band, the second frequency band is different from the first frequency band and includes a resonant frequency of the object.

5. The controller of claim 4, wherein the resonant frequency corresponds to a vibration mode that is one of a torsional vibration mode of the object and a saddle mode of vibration of the object.

6. The controller of claim 1, wherein the processor is further configured to apply a third gain balancing matrix to convert the first control signal to a third intermediate control signal.

7. The controller of claim 1, wherein the first gain balancing matrix is selected to provide a relationship between the first control signal and the second control signal if the object is a rigid body.

8. The controller of claim 1, wherein the processor is further configured to use a gain scheduling matrix to convert an input control signal, representing required forces on the object with respect to a substantially inertial reference, into the first control signal.

9. The controller of claim 1, wherein the first control signal is derived from a feedback loop in the control of an actuator system.

10. The controller of claim 1, wherein the first control signal is derived from a feed forward path in the control of an actuator system.

11. A controller comprising:
   a processor configured to:
      use a gain balancing matrix to convert a first control signal, representing a set of forces desired to be provided to a center of gravity of an object, into a second control signal, representing an equivalent set of forces to be provided by a plurality of actuators, wherein the gain balancing matrix includes a first gain balancing matrix used at least if the first control signal is in a first frequency band and a second gain balancing matrix used at least if the first control signal is in a second frequency band different than the first frequency band; and use additionally a third control signal, to generate the second control signal, wherein the third control signal represents a set of forces desired to be applied to the center of gravity of the object derived from a feedforward path in control of an actuator system.

12. The controller of claim 11, wherein the processor is further configured to sum the first and third control signals to provide a first intermediate control signal;

apply the first gain balancing matrix to the first intermediate control signal to provide a second intermediate control signal;

apply a first difference gain balancing matrix, that is a difference between the first and second gain balancing matrices, to the first control signal to provide a third intermediate control signal;

apply a first filter to the third intermediate control signal to provide a fourth intermediate control signal, the first filter configured to pass signals in the second frequency band;

apply a second difference gain balancing matrix, that is the difference between the first gain balancing matrix and a third gain balancing matrix provided for use with the third control signal, to the third control signal to provide a fifth intermediate control signal;

apply a second filter to the fifth intermediate control signal to provide a sixth intermediate control signal, the second filter configured to pass signals in a third frequency band; and sum the second, fourth and sixth intermediate control signals to provide the second control signal.

13. The controller of claim 12, wherein the third frequency band is the same as the second frequency band.

14. The controller of claim 11, wherein the actuator system is provided to control the position of a short-stroke stage of a positioning system of one of the substrate table and a support for the patterning device.

15. A method comprising:

using a plurality of actuators to apply forces to an object;

applying a first gain balancing matrix to convert a first control signal, representing a set of forces desired to be provided to a center of gravity of the object, to provide a first intermediate control signal;

applying a second gain balancing matrix to the first control signal to provide a second intermediate control signal; and switching between the first and second intermediate control signals according to a frequency of the first control signal in order to provide a second control signal representing an equivalent set of forces to be provided by a plurality of actuators.

* * * * *